US012731707B2

(12) United States Patent
Manini et al.

(10) Patent No.: US 12,731,707 B2

(45) Date of Patent: Sep. 8, 2026

(54) NEG-COATED PERMANENT MAGNET

(71) Applicants: SAES GETTERS S.P.A., Lainate (IT); STRUMENTI SCIENTIFICI CINEL S.R.L., Vigonza (IT)

(72) Inventors: Paolo Manini, Milan (IT); Michele Mura, Arona (IT); Tommaso Porcelli, Milan (IT); Riccardo Signorato, Vigonza (IT)

(73) Assignees: SAES Getters S.p.A., Lainate (IT); STRUMENTI SCIENTIFICI CINEL S.R.L., Vigonza (IT)

( * ) Notice: Subject to any disclaimer, the term of this patent is extended or adjusted under 35 U.S.C. 154(b) by 0 days.

(21) Appl. No.: 19/146,986

(22) PCT Filed: Jan. 30, 2025

(86) PCT No.: PCT/EP2025/052402

§ 371 (c)(1),
(2) Date: Jul. 10, 2025

(87) PCT Pub. No.: WO2025/163071

PCT Pub. Date: Aug. 7, 2025

(65) Prior Publication Data

US 2026/0112526 A1 Apr. 23, 2026

(30) Foreign Application Priority Data

Jan. 31, 2024 (IT) ........................ 102024000001962

(51) Int. Cl.

*B32B 15/04* (2006.01)
*B32B 17/06* (2006.01)

(Continued)

(52) U.S. Cl.

CPC ............ *H01F 1/057* (2013.01); *F04B 37/14* (2013.01); *H01F 1/10* (2013.01); *C23C 14/35* (2013.01)

(58) Field of Classification Search

CPC ................................ C23C 14/35; H01J 7/183

(Continued)

(56) References Cited

U.S. PATENT DOCUMENTS 4,839,085 A * 6/1989 Sandrock ............... B22F 9/023
419/30

6,080,498 A * 6/2000 Kikui ...................... H05H 7/04
427/127

(Continued)

FOREIGN PATENT DOCUMENTS

| | | | |
|---|---|---|---|
| EP | 0869195 | A1 | 10/1998 |
| JP | 2001196209 | A | 7/2001 |

OTHER PUBLICATIONS

International Search Report and Written Opinion issued Mar. 10, 2025 in PCT/EP2025/052402, 13 pages.

*Primary Examiner* — Lauren R Colgan

(74) *Attorney, Agent, or Firm* — Element IP, PLC

(57) ABSTRACT

A permanent magnet usable for an ultra-high vacuum atmosphere is made of a magnetic alloy coated with a non-evaporable getter (NEG) layer made of a binary, ternary or quaternary NEG alloy containing elements selected among Ti, Zr, V, Hf, Nb, Fe, Al and Cu which comprises at least Zr from 20 to 85 at % and V from 8 to 63 at %, with respect to the sum of the alloy elements in the NEG alloy.

8 Claims, 1 Drawing Sheet

(51) Int. Cl.
*F04B 37/14* (2006.01)
*H01F 1/057* (2006.01)
*H01F 1/10* (2006.01)
*C23C 14/35* (2006.01)

(58) Field of Classification Search
USPC ........................................................ 428/469
See application file for complete search history.

(56) References Cited

U.S. PATENT DOCUMENTS

| | | | | |
|---|---|---|---|---|
| 6,211,762 | B1 * | 4/2001 | Kikui | H01F 41/026 428/651 |
| 6,254,694 | B1 * | 7/2001 | Hasegawa | H01F 41/026 427/127 |
| 6,805,980 | B2 * | 10/2004 | Uehara | H01F 1/057 427/127 |
| 7,438,768 | B2 * | 10/2008 | Sakaki | H01F 1/0577 148/303 |
| 7,727,308 | B2 * | 6/2010 | Coda | C22C 16/00 96/108 |
| 2019/0360076 | A1 * | 11/2019 | Gallitognotta | C22C 16/00 |

* cited by examiner

NEG-COATED PERMANENT MAGNET

The present invention relates to a permanent magnet usable for an ultra-high vacuum atmosphere.

More specifically the invention relates to a permanent magnet made of a magnetic material coated with a non-evaporable getter (NEG) layer.

It is widely known in the art that there are several important features required for a satisfactory permanent magnet used for an ultra-high vacuum atmosphere, which consists in having excellent magnetic characteristics, avoiding the generation of absorbed or contaminated gas from the magnet surface, reducing the corrosion phenomena and maintaining the high level of vacuum of the device even after the magnet has been installed.

Thus, in order to solve some of these problems different strategies have been exploited, e.g. the use of an aluminum film and a second film coated on the magnet has been described by EP1032000 with the specific aim of reducing the corrosion of the surface when left to stand for a long time under high-temperature and high-humidity conditions.

Also EP0811994 discloses a permanent magnet with a strongly bonded surface coated layer made of a TiN, AlN or TiAlN alloy in order to prevent any gas generation or gas exhaustion out of the magnet surface layers and, as a consequence, not only reducing the corrosion of the magnet but allowing it to be employed for an undulator used in an ultra-high vacuum atmosphere.

As an alternative, the solution disclosed in the utility model CN206179625 for the same problem of outgassing and the consequent corrosion of the magnet, relies on vacuuming the pores of the permanent magnet, and then coating the surface with a film. According to this solution, the pores are sealed in the film, particularly by repeating the sealing steps of the process, thus preventing the oxidation and corrosion of the surface of the magnet block.

Other documents disclose the coating of permanent magnets for other purposes, such as JP2001196209 teaching that a sintered permanent magnet material of rare earth having a composition of R—Fe—B (wherein R is a rare earth element, e.g. Nd) which is subjected to machining processes can be provided through a heat treatment with a coating of high-melting metal for recovering the deterioration in the magnetic characteristics caused by machining processes. The metal can be one or more of titanium, vanadium, chromium, zirconium, niobium, molybdenum, ruthenium, rhodium, hafnium, tantalum, tungsten, rhenium, osmium, iridium, platinum and their alloys.

However, in all the cases cited in the prior art the different layers coated on the magnet have just the aim of blocking the outgassing process and the consequent corrosion of the magnet and deterioration of the vacuum, but none of them is intended to provide an active function for the vacuum system in which the magnet is placed and such a possibility is not even considered or hinted to.

Therefore, an object of the present invention is to have a permanent magnet with excellent performance with respect to the magnetic and resistance characteristics, and at the same time an active function in the system.

Figure 1:
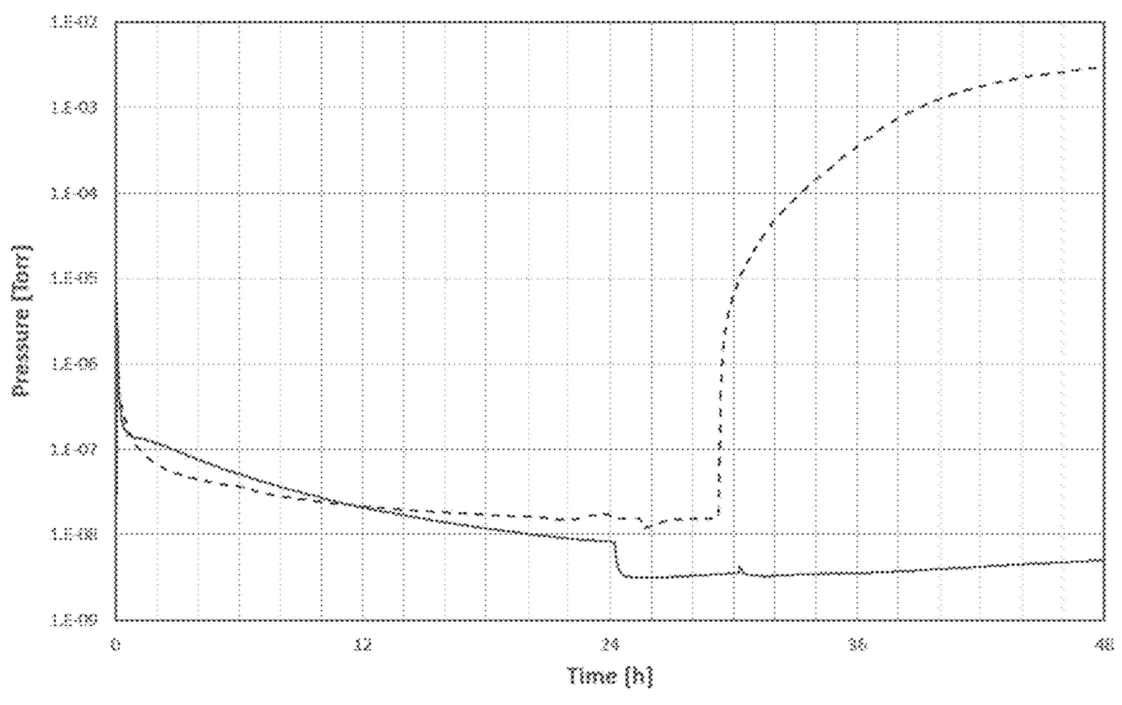
FIG. 1 is a graph showing the pressure in a glass bulb containing a NEG-coated magnet compared to a non-NEG coated one.

The inventors have surprisingly found that the required effects are achieved by a non-evaporable getter (NEG) layer coated on the magnet surface. Indeed the NEG coating prevents the degassing of the component and at the same time increases the pumping of the system in an activated state of the material of the film by its gas absorption (active effect of the film). Thus, due to this double effect of the film, the magnet coated with said specific layer not only contributes to the maintenance of the vacuum, but it also gives the possibility to have a localized pumping in the ultra-high vacuum system.

Object of the present invention is a permanent magnet made of a magnetic material for ultra-high vacuum, coated with a layer consisting of a non-evaporable getter (NEG) alloy.

Said magnetic material which constitutes the permanent magnet can be Ferrite, SmCo or NdFeB, whose respective Curie temperatures are about 450° C., 700-800° C. and 310-340° C., while the NEG composition is a binary, ternary or quaternary alloy containing elements selected among Ti, Zr, V, Hf, Nb, Fe, Al and Cu so that its activation temperature is below the Curie temperature of the magnet being coated.

According to the invention herein disclosed, the NEG alloy comprises at least Zirconium and Vanadium as compositional elements, with an atomic percentage composition which can vary from 20 to 85% for Zirconium and from 8 to 63% for Vanadium with respect to the sum of the alloy elements in the non-evaporable getter alloy.

In another possible embodiment, said NEG alloy comprises as compositional elements Zirconium, Vanadium and Titanium, with an atomic percentage composition which can vary within the following atomic percentage, ranges:

- Zirconium from 20 to 85%, preferably from 20 to 40%;
- Vanadium from 8 to 50%, preferably from 30 to 50%, and
- Titanium from 5 to 40%, preferably from 20 to 40%, said atomic percentage ranges being considered with respect to the sum of Zirconium, Vanadium and Titanium in the non-evaporable getter alloy.

A further preferred composition of said alloy comprises Aluminum in addition to Zirconium, Vanadium and Titanium. In this case the atomic percentage composition requires that: Zirconium is comprised in the atomic range from 38 to 44.8%, Vanadium from 14 to 29%, Titanium from 13 to 15% and Aluminum from 11.5 to 35%, said percentage amounts being with respect to the sum of Zirconium, Vanadium, Titanium and Aluminum in the non-evaporable getter alloy.

Finally, a further NEG alloy suitable for the use in such applications can comprise Zirconium, Vanadium and Iron, with an atomic percentage which can vary within the following ranges: Zirconium from 32 to 63%, Vanadium from 25 to 63% and Iron from 5 to 42%.

As possible example, another preferred getter alloy according to this latter ZrVFe composition is produced and sold by the applicant under the trade name St707, and has an activation temperature around 400° C.

According to the present invention, the layer of NEG composition has a thickness comprised between 0.1 and 10.0 μm, preferably between 0.5 and 2.0 μm.

Figure 2:
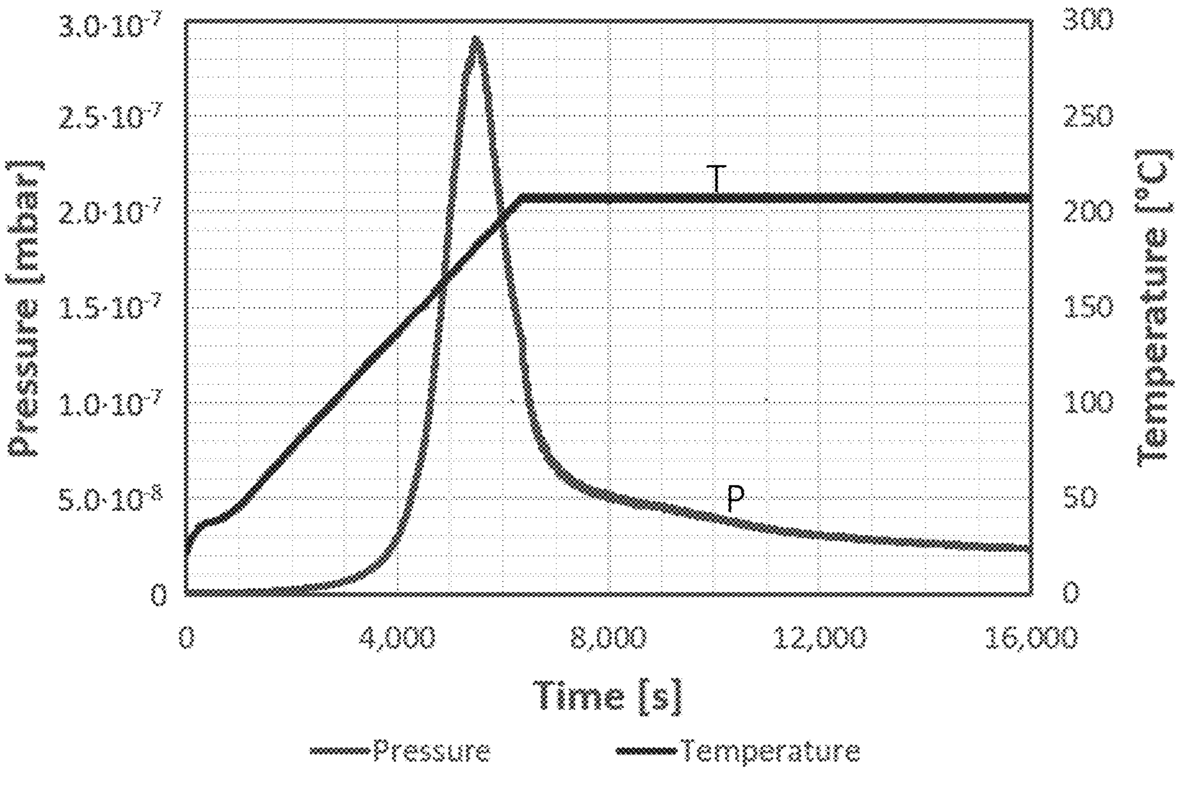
FIG. 2 highlights the activation of a TiZrV NEG coating with a composition according to the present invention of Ti30 Zr30 V40 at % at 210° C., in terms of pressure decrease in the system due to the resulting pumping effect of the NEG coating.

The NEG coating is characterized by a temperature of activation (e.g. 210° C.) that, for the magnetic application herein disclosed, should not exceed the Curie temperature, as clearly shown in FIG. 2 which highlights the activation of a TiZrV NEG coating with a composition according to the present invention of Ti30 Zr30 V40 at % at 210° C., in terms of pressure decrease in the system due to the resulting pumping effect of the NEG coating. Thus, when the Curie temperature is above 210° C. both pumping and outgassing properties are maximized, while when the Curie temperature is below 210° C. only outgassing properties are maximized.

On the contrary, other known NEG alloys such as the alloy St101 with a nominal composition of Zr 84 at % and Al 16 at % requires a temperature of 900° C. for a full activation and a still high temperature of 600° C. for a partial activation.

In an alternative embodiment, the permanent magnet further comprises an intermediate layer between the magnet body and the NEG layer, said intermediate layer being made of an element selected among Ni, Zn, Ti, Zr, V, Hf, Nb and Cu. The reason for this intermediate layer can be, for instance, to protect from corrosion, to make the magnet surface more high-temperature resistant or to guarantee a better adhesion of the top NEG layer.

The permanent magnet realized according to the present invention can be used in a ultra-high vacuum atmosphere such as an undulator, a magnetron sputtering system or a Penning cell.

Specifically, in a preferred embodiment, the Penning cell is a sputter-ion pump or a cold-cathode vacuum gauge.

According to the present invention the ultra-high vacuum system can contain a plurality of said permanent magnets which, in a preferred embodiment, can be placed on two or more parallel surfaces facing each other.

EXAMPLES

Hereinafter, the invention will be explained in more detail with reference to the following non-limiting examples. Modifications or variations of the embodiments here exemplified, obvious to an expert in the art, are encompassed by the appended claims.

A rate-of-rise test was made in a dedicated vacuum system to demonstrate the effectiveness of a NEG-coated magnet compared to a non-NEG coated one.

A commercially-available Ni-coated NdFeB disk (diameter 40 mm, height 10 mm) was coated by magnetron sputtering with an about 1 μm thickness layer of a TiZrV NEG alloy according to the invention, with an atomic % composition of Ti30 Zr30 V40.

Afterwards, the disk was suspended in a glass bulb connected to a stainless steel vacuum system. This system was equipped with a turbomolecular pump, a Bayard-Alpert gauge and an all-metal angle valve. After an 8 h-long bake-out at 190° C. of the entire vacuum system, the NdFeB disk was heated for 24 h at 250° C. to activate the NEG film. At the end of the activation, the disk was cooled down and the all-metal valve closed, in order to isolate the glass bulb containing the NEG-coated disk from the turbomolecular pump; the value of pressure inside the bulb was recorded by the Bayard-Alpert gauge.

FIG. 1 is a graph showing the pressure in the glass bulb containing a NEG-coated magnet compared to a non-NEG coated one.

The solid line in the graph of FIG. 1 shows the pressure behavior with the NEG-coated magnet during the NEG activation phase (0-24 h), the cooling down phase (24-29 h) and the recordal phase (29-48 h). The pressure inside the bulb remained in the E-9 Torr range after the valve closure.

At the end of the test, the same procedure (bake-out+disk heating+cooling down) was applied to a second, identical Ni-coated NdFeB disk that was not NEG-coated.

The respective dashed line in the same graph shows that, after the valve closure, pressure quickly increased and was in the mid E-3 Torr range after 48 h, due to the higher outgassing of the Ni-coated NdFeB magnet and to the lack of any pumping inside the isolated glass bulb. These experimental results confirm the outgassing properties and pumping effect of the external NEG coating of the magnet according to the invention when compared to a magnet whose external coating is nickel.

The functional properties of the coated material can be further characterized by the amount of gas that the getter can absorb at room temperature, after being activated at a specific temperature for a specific time. The test is carried out following the standard ASTM F798-82.

The testing gas is carbon monoxide CO, the NEG coating is activated at 250° C. for 15 minutes in vacuum before exposing the material to CO gas. The results of the samples prepared according to the present invention, characterized by the following compositions in atomic %: Zr73 V18 Al9, or Zr77 V16 Al7 or Zr76 V20 Fe4, show a significant CO absorption, specifically higher than 0.4 [$cm^3\cdot Torr/cm^2$], while maintaining reduced temperature of activation.

On the contrary, if we consider as comparative example the NEG alloy with atomic % composition Zr75 Co 22 RE 3 (commonly used in the market as NEG coating in MEMS devices and sold by the applicant under the trade name St787), it reveals lower gas absorption values, specifically less than 0.2 [$cm^3\cdot Torr/cm^2$], and a consequent reduction of efficiency after partial NEG activation.

While this invention has been described with respect to preferred examples, it should be understood that the invention is not limited to those precise examples; rather, many modifications and variations would present themselves to those skilled in the art without departing from the scope and spirit of this invention.

The invention claimed is:

1. A permanent magnet made of a magnetic material for ultra-high vacuum atmosphere coated with at least one layer made of a binary, ternary or quaternary non-evaporable getter alloy comprising elements selected from the group consisting of Ti, Zr, V, Hf, Nb, Fe, Al and Cu, wherein said non-evaporable getter alloy comprises at least Zirconium and Vanadium with an atomic percentage composition which can vary within the following ranges: Zirconium from 20 to 85%, Vanadium from 8 to 63%, with respect to the sum of the alloy elements in the non-evaporable getter alloy.

2. A permanent magnet according to claim 1, wherein the magnetic material is Ferrite, SmCo or NdFeB.

3. A permanent magnet according to claim 1, wherein the layer of non-evaporable getter alloy has a thickness comprised between 0.1 and 10 μm.

4. A permanent magnet according to claim 1, further comprising an intermediate layer between the magnet and the non-evaporable getter layer, said intermediate layer being made of an element selected from the group consisting of Ni, Cu, Zn, Ti, Zr, V, Hf, Nb.

5. An ultra-high vacuum system comprising at least one magnet according to claim 1.

6. The ultra-high vacuum system according to claim 5, wherein said system is an undulator, a magnetron sputtering system or a Penning cell.

7. The ultra-high vacuum system according to claim 6, wherein the Penning cell is a sputter-ion pump or a cold-cathode vacuum gauge.

8. The ultra-high vacuum system according to claim 5, wherein it includes a plurality of magnets placed on two or more parallel surfaces facing each other.

* * * * *